United States Patent [19]

Tyree

[11] 4,127,317

[45] Nov. 28, 1978

[54] ELECTRICAL CONNECTORS WHICH MAY BE SHORTENED TO PROVIDE FEWER CONTACTS

[75] Inventor: Christopher W. Tyree, Darling Point, Australia

[73] Assignee: Bunker Ramo Corporation, Oak Brook, Ill.

[21] Appl. No.: 811,021

[22] Filed: Jun. 29, 1977

[30] Foreign Application Priority Data

Jul. 6, 1976 [AU] Australia ........................... 15637/76

[51] Int. Cl.[2] ......................... H01R 13/42; H05K 1/07

[52] U.S. Cl. ............................ 339/134; 339/176 MP; 339/210 M

[58] Field of Search ............ 339/176 MP, 125 R, 134, 339/210 M, 132 B

[56] References Cited

U.S. PATENT DOCUMENTS 3,243,761 3/1966 Piorunneck .................. 339/176 MP

FOREIGN PATENT DOCUMENTS 1,282,104 7/1972 United Kingdom ............. 339/176 MP

*Primary Examiner*—Neil Abrams

*Attorney, Agent, or Firm*—F. M. Arbuckle; Thomas G. Scavone

[57] ABSTRACT

Connectors, for printed circuit boards and the like, are disclosed which may be cut to desired lengths. The connectors are formed from bodies of insulating material such as thermoplastic polyester, having receptacles, or cavities, which support pluralities of contacts. Each contact is positioned in one of the receptacles by engagement of a ridge in the body with a corresponding slot in the contact. The contacts are locked in their respective receptacles by a slide element which functions cooperatively with a slide receptacle in the contact block. An assembled connector may be shortened by severing the body to remove portions of the body bearing undesired contacts without disturbing the remaining contacts. Alternatively, before assembly, the insulating block may be cut to a selected length so that it will accommodate a particular number of contacts and avoid excess contacts. Each connector may preferably be provided with mounting feet, one or both of which may be removed before the connector is shortened and then be inserted afterward in a new position to provide the new shorter connector with mounting feet.

4 Claims, 24 Drawing Figures

Fig-1
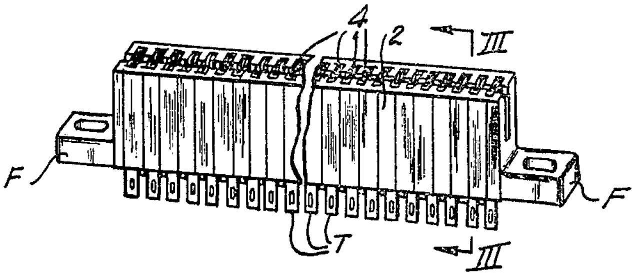
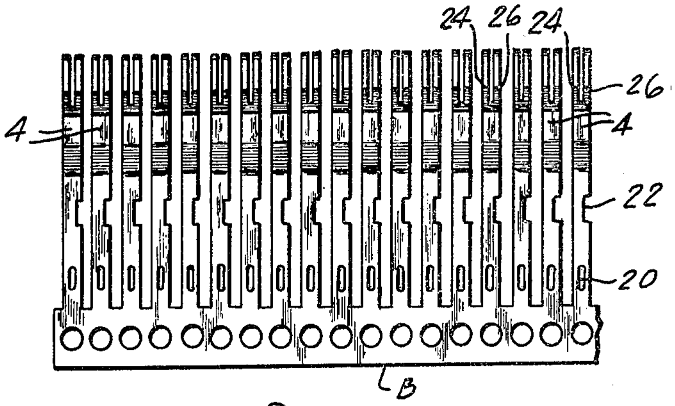
Fig-2
Fig-3
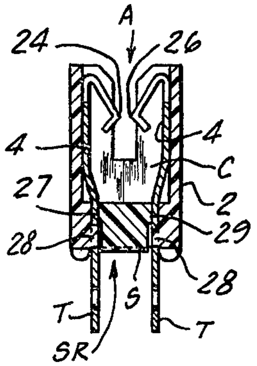
Fig-4
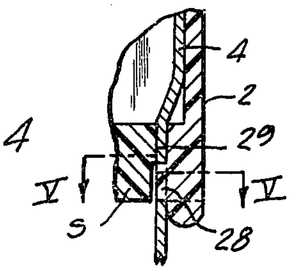
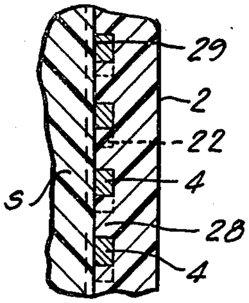
Fig-5
Fig-6
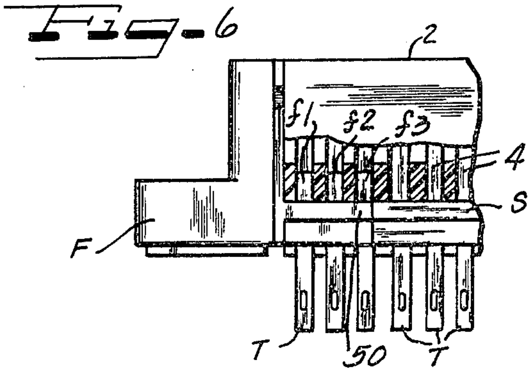
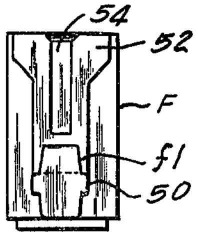
Fig-7
Fig-8
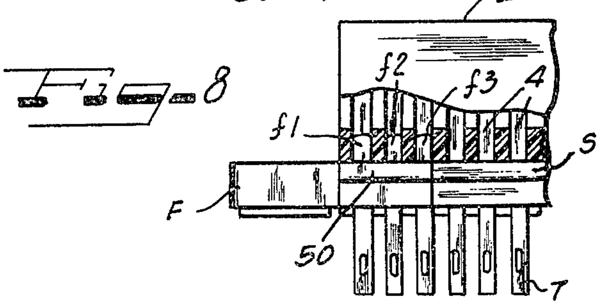

Fig. 9
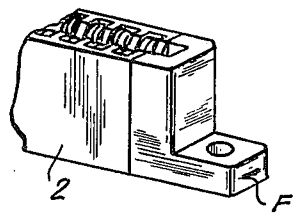
Fig. 10
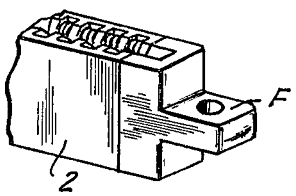
Fig. 11
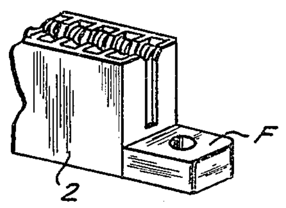
Fig. 12
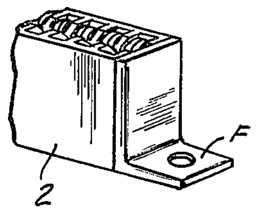
Fig. 13
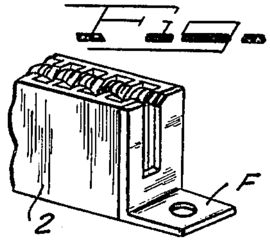
Fig. 14
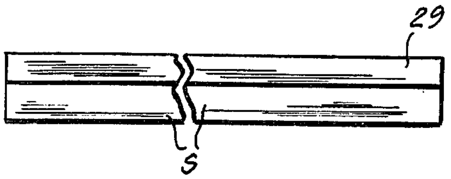
Fig. 15
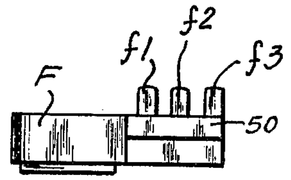
Fig. 16
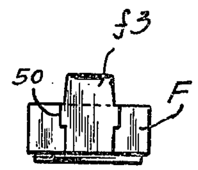
Fig. 17
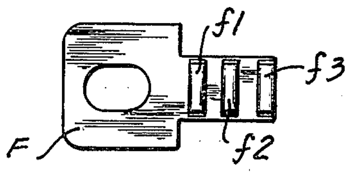
Fig. 18
Fig. 19
Fig. 20
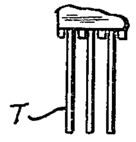
Fig. 21
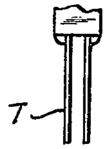
Fig. 22
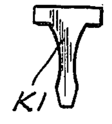
Fig. 23
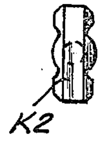
Fig. 24

ELECTRICAL CONNECTORS WHICH MAY BE SHORTENED TO PROVIDE FEWER CONTACTS

BACKGROUND OF THE INVENTION

1. Field of the Invention

The invention relates to connectors for printed circuits and the like. In particular, it relates to connectors formed individually by the assembly of blocks of insulating material and contacts and to such assemblies which may readily be shortened, either before or after completion of their assembly, to eliminate undesired lengths of connector and provide a desired number of contacts only.

2. Description of the Prior Art

The prior art connectors have generally been provided in sizes to include fixed numbers of contacts, such as 10 or 20 or multiples thereof. When there has been a need for more contacts than are in a standard unit, but fewer than in the next larger size, the next larger size has been used with a corresponding waste of contacts and the cluttering of space with unused parts.

The prior art connectors have been available with contacts of only one or two tail styles. In addition, contacts used in the prior art often have not enabled adequate contact to be established or to be maintained and have not been adaptable to use with different mounting feet.

SUMMARY OF THE INVENTION

Accordingly, it is an object of the present invention to provide connectors which may be shortened to contain only a desired number of contacts. It is a further object to provide connectors having contacts with many different tail styles. It is still a further object to provide connectors which may be used with different mounting feet. It is an additional object to provide connectors having contacts which insure positive engagement with regular or irregular board surfaces. It is yet another object to provide connectors which may readily be assembled with standard numbers of contacts and then cut to leave only the desired number of contacts as needed.

In accordance with the foregoing objects and others ancillary thereto, blocks for connectors are formed of thermoplastic or other insulating material, to include a plurality of receptacles, or cavities, one for each of a plurality of contacts. Each receptacle is shaped to fit a contact and each includes a part of a slide receptacle incorporating a ridge, or molded key, which fits into an opening, or recess in the body of the contact. The contacts are fastened in place by lodging their respective recesses against the corresponding molded keys and locking the recesses and keys between the slide receptacle and a slide element. Contacts having different tail styles and mounting feet or different types may be used. Positive engagement with printed circuits is assured by using front active portions of bifurcated bows, which ensure two points of engagement at all times. The resilience of the special alloy of the active portions assures a positive wiping action on insertion that removes any films, such as are formed by oxides or oil, and assures that the contacts will not deform under stress. The connectors may be secured in the blocks in such a way that the blocks can be shortened without damage to leave a desired number of contacts. The blocks are adapted to enable mounting feet to be placed in new positions when the blocks are shortened or to enable the interchange of different connecting feet.

BRIEF DESCRIPTION OF THE DRAWINGS

The above mentioned and other features and objects of this invention and the manner of obtaining them will become apparent, and the invention itself will be best understood by reference to the following description of an embodiment of the invention taken in conjunction with the accompanying drawings, in which FIG. 1 is a perspective view of a connector according to the invention;

FIG. 2 is a plan view showing a plurality of contacts formed from a sheet of contact material as they appear before insertion into a block and before the common portion has been removed;

FIG. 3 is a sectional view along III—III in the connector of FIG. 1;

FIG. 4 is an enlarged view of a portion of FIG. 4;

FIG. 5 is an enlarged sectional view along V—V in FIG. 3;

FIG. 6 is a side view of a portion of a connector in partial section showing details of relationships between components of use in the practice of the invention;

FIG. 7 is an end view of the foot from FIG. 6;

FIG. 8 is a view in partial section of an embodiment of the invention illustrating the use of a mounting foot having a low profile in conjunction with a slide element;

FIGS. 9–13 are views in perspective showing a number of different mounting feet as they might be employed in the practice of the invention;

FIG. 14 is an end view of a slide according to the invention;

FIG. 15 is a side view of the slide in FIG. 14;

FIG. 16 is a side view of a foot having a low profile;

FIG. 17 is an end view of the foot of FIG. 16;

FIG. 18 is a top view of the foot of FIG. 16;

FIGS. 19–22 are examples of contact tails employed with various contacts in the practice of the invention;

FIG. 23 is a view of an over-contact key for use as a polarizing key;

FIG. 24 is a view of a between-contact key for use as a polarizing key.

DESCRIPTION OF THE PREFERRED EMBODIMENT

Turning now to FIG. 1 a view in perspective is shown of a connector according to a preferred embodiment of the invention. In this view, the connector 2 includes a plurality of contacts 4 which terminate in tails T. The connector shown in this view is arranged with a plurality of parallel spaced apart grooves so that it may be cut into two or more parts after assembly as shown and each of the parts may be employed as a separate connector without disrupting the arrangement of the remaining contacts. Alternatively, the length of the connector may be cut to accommodate any selected number of contacts before assembly has been completed.

To assure greater utility for each connector formed by cutting an existing connector in two, mounting feet such as F are provided with means by which they may be inserted into the base or rear, of a connector to occupy positions such as are shown in FIG. 1. These mounting feet may be removed and replaced with feet of different designs when needed.

FIG. 2 is a plan view of a plurality of contacts 4 as they appear before assembly into a connector block and before the metal bridge B, by which they are interconnected, has been severed. From this figure it is clear that the contacts 4 may be formed from sheet metal and that the metal bridge B is retained to hold the contacts together until they have been assembled in a contact block, after which the metal bridge is severed. Each contact in this view includes a closed solder eyelet 20 which is part of the contact tail. Each contact also includes a slot, or recess 22, which is arranged to mate with a ridge, or key, in the block and is of importance of securing the contact in the connector block. As indicated too, actual electrical engagement with conduction pads or to printed circuit boards is made by front active bifurcated contacts represented by contact faces 24, 26 on the contact element. The bifurcated contact faces 24, 26 enable a better electrical connection to be established in the event the pad to be contacted has an uneven surface or is part of a surface which is not parallel to the contacts. Resiliency of the contact material also assures more positive contact with conduction pads.

FIG. 3 is a sectional view taken along III—III in FIG. 1 showing details of relationships between connector walls, contacts and means holding the contacts in place. In particular, it will be seen that contact faces 24, 26, in the front portion A of the receptacle or cavity, are positioned so that contact face 24 is opposite contact face 26. These contact faces thereby constitute contact areas for both sides of a printed circuit board and also provide spring action against both sides of such a board. A slide element S is shown in position in a slide receptacle SR (which is part of the rear portion of the contact receptacle) within the base of the connector 2. As indicated, the slide element has a wide segment terminating at faces 27, 29 which rides in the slide receptacle above the ridges 28. In this way, the slide element is securely held in place having been pushed into place in the slide receptacle from the end of the connector block 2. This arrangement of the slide element in the slide receptacle aligns the contacts 4 and secures them in their respective receptacles in the connector block, or supportive body, at 2.

The slide element S may extend the full length of the connector in a desired construction where no feet F are employed. Usually, however, the slide will be shorter than the connector to permit insertion of teeth associated with a foot into the connector to help lock the foot, the contact elements and the slide in place. It will be clear from the view of FIG. 3 that each connector includes receptacles, or cavities, C having front portions indicated at F and rear portions indicated by the slide receptacle SR.

FIG. 4 is an enlarged view of a portion of FIG. 3 to more clearly illustrate relationships between the connector block 2, ridges 28 on the connector block, a contact element 4 and the slide element (or slide block) S.

FIG. 5 is an enlarged sectional view of FIG. 4 taken along line V—V. This view shows further details concerning relationships between a slide S, a contact element 4, a slot or recess 22 in the contact element 4 and a ridge 28. In particular, it demonstrates how the various elements are interlocked to provide a secure connector.

An exemplary connector assembly including a mounting foot F is shown in FIG. 6 is association with a portion of a connector block 2 (in partial section) and a slide element S. The foot includes a plurality of teeth *f*1, *f*2 and *f*3 which are dimensioned to fit into the rear openings for the contact receptacles of a connector block 2. The element 50 forming part of the foot integral to the teeth *f*1, *f*2 and *f*3 is dimensioned so that it may be pressed into the slide receptacle SR (FIG. 3) in such a way as to retain contact elements 4 within the contact receptacles or cavities of a block 2. The slide S is employed to retain the remaining contact elements 4 within the cavities or receptacles.

FIG. 7 is an end view of the foot F from FIG. 5 showing the end of the element 50 which bears the tooth *f*3. A smooth face at 52 is provided to make low friction contact with the end face of the connector block 2 and thus facilitate assembly of F to the block 2 and disassembly from the block. The opening 54 is provided to permit a printed circuit board to be inserted which extends outside the connector.

Details concerning the relationships between another exemplary mounting foot F, a connector block 2, contacts 4 and a slide element S are shown in FIG. 8. The mounting foot F, together usually with a second foot at the other end of the block, is provided so that the connector block 2 may be fastened down. In some instances such mounting feet will not be used and it should be noted the invention is admirably suited to use without such feet.

As in FIG. 6, the foot F includes a plurality of teeth *f*1, *f*2, *f*3. These teeth are provided to be fitted into receptacles holding contacts within the block 2. The end of the foot F abuts the slide element S and together with the slide element S retains the contacts in the block 2.

FIGS. 9, 10, 11, 12 and 13 illustrate various mounting feet in place at the end of a connector block 2. FIG. 9 shows a closed plastic foot similar to that shown in FIGS. 6 and 7. FIG. 10 illustrates a closed stepped plastic foot. FIG. 11 involves an open plastic foot, i.e. a foot with an opening at 100 which matches the internal openings of the block 2 and can therefore receive printed circuit boards and the like to permit use of the connector with oversize boards when necessary. FIG. 12 illustrates the use of a closed metal foot. FIG. 13 shows the use of an open metal foot.

FIG. 14 is an end view of a slide S showing a wide portion bounded by the edges 27 and 29 which enable it to engage the inner walls of a slide receptacle formed in a connector block. FIG. 15 is a side view of the slide of FIG. 14.

FIGS. 16, 17 and 18 are respectively side, end and top views of a foot F, provided in accordance with the view in FIG. 8. From these views and FIGS. 6 and 8 it is clear that the foot includes teeth *f*1, *f*2, *f*3 which may be fitted into the rear portions of the cavities in a connector to capture contacts 4 in those cavities.

FIGS. 19–22 show representations of contact tails T which may be employed in various embodiments of the invention. These tails include long dip solder eyelets as shown in FIG. 19. Short dip solder eyelets are illustrated in FIG. 20. Wire wrap tails, as terminals, are shown in FIGS. 21 and 22.

Polarizing keys for use with embodiments of the present invention are shown in FIGS. 23 and 24. FIG. 23 is an illustration of an over-contact key K1. FIG. 24 is an illustration of a between-contact key K2.

While the principles of the invention have been described above in connection with specific apparatus and applications, it is to be understood that this description is made only by way of example and not as a limitation on the scope of the invention.

I claim:

1. An electrical connector, comprising: a supportive body having a row of contact cavities supporting a plurality of contact elements; retaining means positioned along said row for use in retaining contact elements in said row; additional retaining means for use in locking contact elements in said row; receptacle means disposed along said row for cooperatively receiving said additional retaining means and enabling contact elements to be locked in the body, the receptacle means also including a slot arranged parallel to said row to permit motion of a part of said additional retaining means along an axis parallel to said row, said slot forming extensions of said contact cavities; the additional retaining means including a slide longitudinally movable in said slot for securing the contact elements in the cavities against transverse motion, and a mounting foot adaptable to fit into the slot in a direction transverse to the slot, the foot having a tooth adaptable to fit into a contact cavity to prevent displacement of the foot and the slide along the slot, and to retain a contact element positioned within the cavity.

2. The invention as claimed in claim 1, in which the retaining means includes a plurality of ridges disposed in said body along the row of contact cavities for use in engaging the contact elements.

3. The invention as claimed in claim 1, in which a row of contact elements is positioned along one edge of the row of contact cavities, and the contact elements are held in place in said contact cavities by interaction between the retaining means and the additional retaining means.

4. The invention as claimed in claim 1, in which said connector is severable between contact elements to permit the connector to be shortened and the number of contacts to be reduced without damage to the relationship of the connector to the remaining contacts.

* * * * *